(12) United States Patent
Peron

(10) Patent No.: US 8,130,894 B2
(45) Date of Patent: Mar. 6, 2012

(54) DATA PROCESSING APPARATUS AND METHOD FOR USE WITH A 4K INTERLEAVER IN A DIGITAL VIDEO BROADCASTING (DVB) STANDARD

(75) Inventor: Jean-Luc Peron, Suresnes (FR)

(73) Assignee: Sony Europe Limited, Weybridge (GB)

( * ) Notice: Subject to any disclaimer, the term of this patent is extended or adjusted under 35 U.S.C. 154(b) by 729 days.

(21) Appl. No.: 12/051,541

(22) Filed: Mar. 19, 2008

(65) Prior Publication Data

US 2008/0298487 A1 Dec. 4, 2008

Related U.S. Application Data

(63) Continuation of application No. 10/806,524, filed on Mar. 23, 2004, now Pat. No. 7,426,240.

(30) Foreign Application Priority Data

Mar. 25, 2003 (EP) ..................................... 03290754

(51) Int. Cl.
*H04K 1/00* (2006.01)

(52) U.S. Cl. ............................ 376/260; 370/203; 455/59
(58) Field of Classification Search .................. 375/260; 370/203; 455/59
See application file for complete search history.

(56) References Cited

U.S. PATENT DOCUMENTS

| 5,799,033 A | 8/1998 | Baggen |
| 6,353,900 B1 | 3/2002 | Sindhushayana et al. |
| 2006/0062314 A1 | 3/2006 | Palin et al. |

OTHER PUBLICATIONS

European Telecommunications Standards Institute: "Digital Video Broadcasting (DVB); Framing structure, channel coding and modulation for digital terrestrial television", ETSI EN 300 744 V1.4.1, Jan. 2001, XP002207124, pp. 1-49.
Anonymous: "Features of ISDB-T" Digital Broadcasting Experts Group (DIBEG), 'Online!, Jul. 28, 2000, XP002249911.
ETSI (ETSI EN 300 744 V1.5.1 (2004-1.1)) in the annex F pp. 50-60, ETSI Nov. 2004.
European Search Report issued Oct. 7, 2009, in European Patent Application No. 09010707.9.

*Primary Examiner* — Juan A Torres
(74) *Attorney, Agent, or Firm* — Oblon, Spivak, McClelland, Maier & Neustadt, L.L.P.

(57) ABSTRACT

A data processing apparatus maps input symbols to be communicated onto a predetermined number of carrier signals of an Orthogonal Frequency Division Multiplexed (OFDM) symbol. The data processor includes an interleaver memory which reads-in the predetermined number of data symbols for mapping onto the OFDM carrier signals. The interleaver memory reads-out the data symbols on to the OFDM carriers to effect the mapping, the read-out being in a different order than the read-in, and the order being determined from a set of addresses. The set of addresses are generated from an address generator. The address generator includes a linear feedback shift register and a permutation circuit.

31 Claims, 6 Drawing Sheets

DATA PROCESSING APPARATUS AND METHOD FOR USE WITH A 4K INTERLEAVER IN A DIGITAL VIDEO BROADCASTING (DVB) STANDARD

CROSS-REFERENCE TO RELATED APPLICATIONS

The present application is a continuation of U.S. application Ser. No. 10/806,524 filed on Mar. 23, 2004, and in turn claims priority to EP 03290754.5 filed Mar. 25, 2003. The entire contents of U.S. application Ser. No. 10/806,524 is incorporated by reference herein.

FIELD OF INVENTION

The present invention relates to data processing apparatus operable to map input symbols onto carrier signals of an Orthogonal Frequency Division Multiplexed (OFDM) symbol.

The present invention also relates to data processing apparatus operable to de-map symbols received from a predetermined number of carrier signals of an OFDM symbol into an output symbol stream.

BACKGROUND OF THE INVENTION

The Digital Video Broadcasting-Terrestrial standard (DVB-T) utilises Orthogonal Frequency Division Multiplexing (OFDM) to communicate data representing video images and sound to receivers via a broadcast radio communications signal. There are known to be two modes for the DVB-T standard which are known as the 2 k and the 8 k mode. The 2 k mode provides 2048 sub-carriers whereas the 8 k mode provides 8192 sub-carriers.

In order to improve the integrity of data communicated by either the 2 k mode or the 8 k mode a symbol interleaver is provided in order to interleave input data symbols as these symbols are mapped onto the carrier signals of an OFDM symbol. Such a symbol interleaver comprises an interleaver memory in combination with an address generator. The address generator generates an address for each of the input symbols, each address indicating one of the carrier signals of the OFDM symbol onto which the data symbol is to be mapped. For the 2 k mode and the 8 k mode an arrangement has been disclosed in the DVB-T standard for generating the addresses for the mapping. The address generator is known to comprise a linear feed back shift register which is operable to generate a pseudo random bit sequence and a permutation circuit. The permutation circuit permutes the order of the content of the linear feed back shift register in order to generate an address. The address provides an indication of one of the OFDM carriers for carrying an input data symbol stored in the interleaver memory, in order to map the input symbols onto the carrier signals of the OFDM symbol.

As well as the 2 k mode and the 8 k mode it has also been proposed to provide a 4 k mode. The 4 k mode has been used in the Japanese standard for digital broadcast television, which is the Integrated Service Digital Broadcasting (ISDB) system.

SUMMARY OF INVENTION

According to an aspect of the present invention there is provided a data processing apparatus operable to map input symbols to be communicated onto a predetermined number of carrier signals of an Orthogonal Frequency Division Multiplexed (OFDM) symbol. The data processing apparatus comprises an interleaver memory operable to read-in the predetermined number of data symbols for mapping onto the OFDM carrier signals, and to read-out the data symbols for the OFDM carriers to effect the mapping. The read-out is in a different order than the read-in, the order being determined from a set of addresses, with the effect that the data symbols are interleaved on the carrier signals. The set of addresses is determined by an address generator, an address being generated for each of the input symbols to indicate one of the carrier signals onto which the data symbol is to be mapped.

The address generator comprises a linear feedback shift register including a predetermined number of register stages and is operable to generate a pseudo-random bit sequence in accordance with a generator polynomial, and a permutation circuit and a control unit. The permutation circuit is operable to receive the content of the shift register stages and to permute the bits present in the register stages in accordance with a permutation order to form an address of one of the OFDM carriers. The control unit is operable in combination with an address check circuit to re-generate an address when a generated address exceeds the maximum number of carriers. The data processing apparatus is characterized in that the predetermined number of OFDM carrier signals is substantially four thousand, and the linear feedback shift register has eleven register stages with a generator polynomial for the linear feedback shift register of $R'_i[10]=R'_{i-1}[0] \oplus R'_{i-1}[2]$. The permutation order forms an eleven bit address $R_i[n]$ for the i-th data symbol from the bit present in the n-th register stage $R'_i[n]$ in accordance with the table:

| $R'_i[n]$ for n = | 10 | 9 | 8 | 7 | 6 | 5 | 4 | 3 | 2 | 1 | 0 |
|---|---|---|---|---|---|---|---|---|---|---|---|
| $R_i[n]$ for n = | 7 | 10 | 5 | 8 | 1 | 2 | 4 | 9 | 0 | 3 | 6 |

Although it is known within the DVB-T standard to provide the 2 k mode and the 8 k mode, there are advantages in providing a 4 k mode. Whilst the 8 k mode provides an arrangement for establishing a single frequency network with sufficient guard periods to accommodate larger propagation delays between DVB transmitters, the 2 k mode is known to provide an advantage in mobile applications. This is because the 2 k symbol period is only one quarter of the 8 k symbol period, allowing the channel estimation (based on scattered pilots embedded in each symbol) to be more frequently updated allowing the receiver to track the time variation of the channel due to doppler and other effects more accurately. The 2 k mode is therefore advantageous for mobile applications. However, the 2 k mode requires a multiple frequency network thereby complicating an arrangement of transmitters to provide a broadcast system. A 4 k mode provides an advantage of a reasonable good reception for mobile users even at high driving speeds, which thereby cause increased doppler shift, without a need for an expensive inter-carrier interference cancellation scheme. A reasonably cost effective implementation of a broadcast network can also be implemented. However, in order to provide the 4 k mode a symbol interleaver must be provided for mapping the input data symbols onto the carrier signals of the OFDM symbol.

Embodiments of the present invention can provide a data processing apparatus operable as a symbol interleaver for mapping data symbols to be communicated on an OFDM symbol, having substantially four thousand carrier signals. In one embodiment the number of carrier signals is three thousand and twenty four. As such a 4 k mode can be provided for example for a DVB standard, such as DVB-T or DVB-H. The DVB-H standard (Digital Video Broadcasting—Handheld is related to DVB-T. DVB-H was formally known as DVB-X.

DVB-H signals are suited for reception by handheld devices such as pocket mobile terminals.

Mapping data symbols to be transmitted onto the carrier signals of an OFDM symbol, where the number of carrier signals is substantially four thousand, represents a substantial technical problem requiring simulation analysis and testing to establish an appropriate generator polynomial for the linear feedback shift register and the permutation order. This is because the mapping requires that the symbols are interleaved onto the carrier signals with the effect that successive symbols from the input data stream are separated in frequency by a greatest possible amount in order to optimise the performance of error correction coding schemes.

Error correction coding schemes such as Reed-Solomon coding and convolutional coding perform better when noise and degradation of the symbol values resulting from communication is un-correlated. Some radio channels such as those used for DVB-T may suffer from correlated fading in both the time and the frequency domains. As such by separating encoded symbols on to different carrier signals of the OFDM symbol by as much as possible, the performance of error correction coding schemes can be increased.

It has been discovered from simulation performance analysis that the generator polynomial for the linear feed back shift register in combination with the permutation circuit order indicated above, provides a good performance in the presence of typical channel noise and fading conditions. Furthermore, by providing an arrangement which can implement address generating for both the 2 k mode and the 8 k mode as well as the 4 k mode by changing the taps of the generator polynomial for the linear feed back shift register and the permutation order, a cost effective implementation of the symbol interleaver for the 4 k mode is provided. Furthermore, a transmitter and a receiver can be changed between the 2 k mode, 4 k mode and the 8 k mode by changing the generator polynomial and the permutation orders. This can be effected in software (or by the embedded transmission parameter signalling (TPS) channel in the receiver) whereby a flexible implementation is provided.

Various aspects and features of the present invention are defined in the appended claims. Further aspects of the present invention include a data processing apparatus operable to de-map symbols received from a predetermined number of carrier signals of an Orthogonal Frequency Division Multiplexed (OFDM) symbol into an output symbol stream, as well as a transmitter and a receiver.

BRIEF DESCRIPTION OF DRAWINGS

Embodiments of the present invention will now be described by way of example only with reference to the accompanying drawings, wherein like parts are provided with corresponding reference numerals, and in which.

DESCRIPTION OF PREFERRED EMBODIMENTS

The existing OFDM-based DVB-T standard is composed of a 2 k and an 8 k mode, which means that the bandwidth used to transmit the signal is divided into either 2048 sub-carriers (2 k mode) or 8192 (8 k mode). The 2 k mode presents some interesting features with respect to mobility. In effect, the short symbol time of this mode allows good doppler performance in mobile environments. On the other hand, the 8 k mode gives the possibility to network planners to build a sparse, hence cheap, SFNs (Single Frequency Network). The investigations carried out on the subject showed that the introduction of a 4 k mode would be a good trade-off between these two modes. It would give reasonably good reception for mobile users even at high driving speeds, without the need for a complicated and costly ICI (Inter Carrier Interference) cancellation scheme. It would also help to keep the cost of the network to a reasonable level. This document describes a new symbol interleaver for this 4 k mode.

Figure 1:
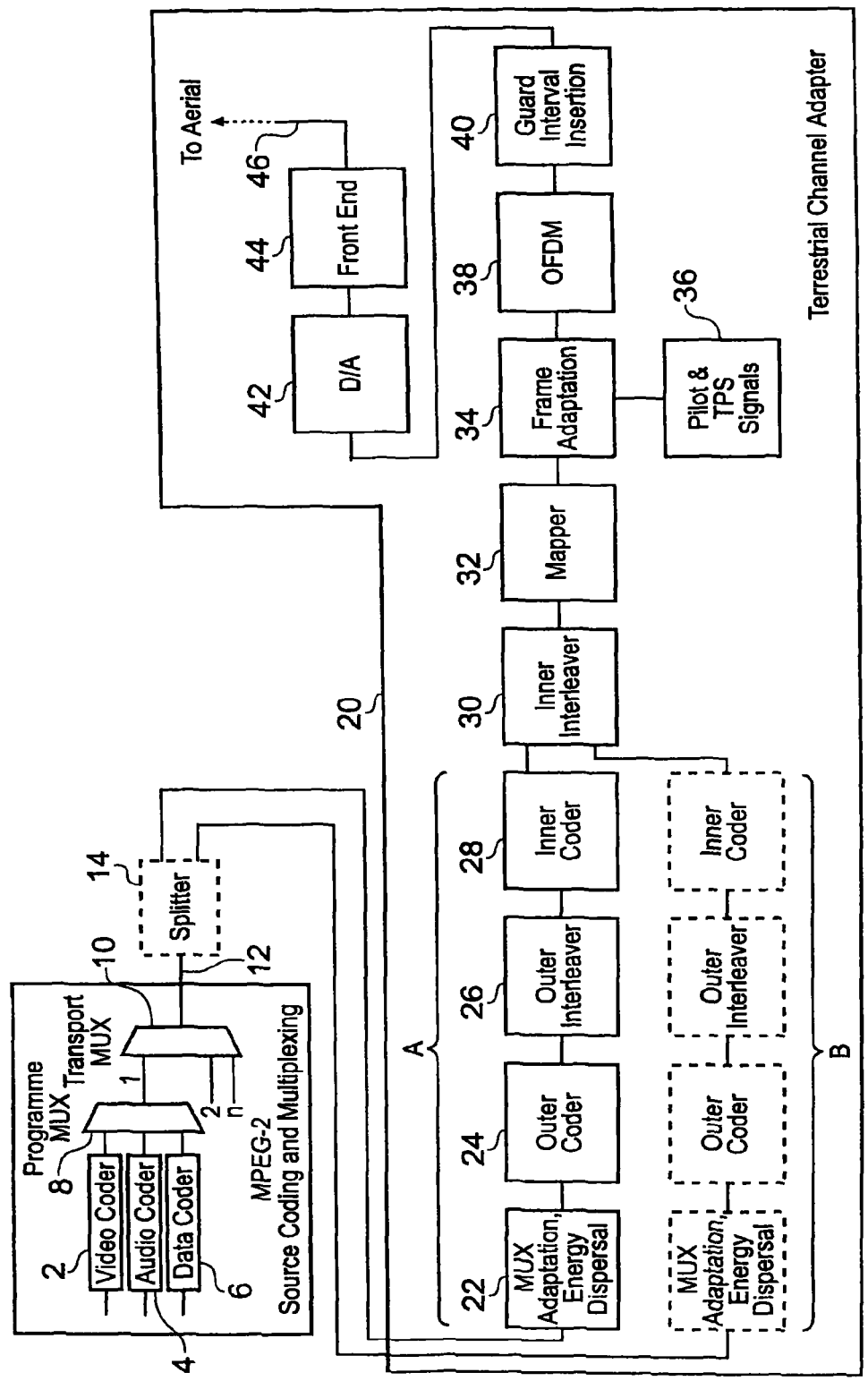
FIG. 1 is a schematic block diagram of a Coded OFDM transmitter which may be used, for example, with the DVB-T standard.

FIG. 1 provides an example block diagram of a Coded OFDM transmitter which may be used for example to transmit video images and audio signals in accordance with the DVB-T standard. In FIG. 1 a program source generates data to be transmitted by the COFDM transmitter. A video coder 2, and audio coder 4 and a data coder 6 generate video, audio and other data to be transmitted which are fed to a program multiplexer 8. An output of the program multiplexer 8 is fed to a transport multiplexer 10 which forms a multiplexed transport stream with other information required to communicate the video, audio and other data. The transport multiplexer 10 provides a transport stream on a connecting channel 12 to a splitter 14. The splitter divides the transport stream into different branches A and B which provide different forward error correction encoding and interleaving. For simplicity, only branch A will be described.

As shown in FIG. 1 a COFDM transmitter 20 receives the transport data stream at a multiplexer adaptation and energy dispersal block 22. The multiplexer adaptation and energy dispersal block 22 randomises the transport stream data and feeds the appropriate data to an outer encoder 24 which performs a first outer coding of the transport data. An outer interleaver 26 is provided to interleave the encoded data symbols which for the example of DVB-T is the Reed-Solomon (RS) code so that the outer interleaver interleaves RS symbols. An inner encoder 28 is arranged to convolutionally encode the data from the outer interleaver using a convolutional encoder the encoded data being fed to an inner interleaver 30. The inner interleaver 30 may also receive coded data from the second encoding arm B.

An output of the inner interleaver is a set of data symbols which are then mapped onto constellation points of a modulation scheme. For the example of the DVB-T shown, the modulation scheme is QPSK (DVB-T can have 4 bits/carrier 16 QAM or 6 bits/carrier 64 QAM as well as QPSK). Each data symbol from the inner interleaver 30 is then mapped onto one of the COFDM carrier signals by a mapping processor 32. The COFDM symbol is then generated by a frame adaptation processor 34 which introduces pilot and synchronising signals fed from a signal former 36. An OFDM generator 38 then forms the OFDM symbol in the time domain which is fed to a guard insertion processor 40 for generating a guard interval between symbols, and then to a digital to analogue convertor 42 and finally to an RF amplifier within an RF front 44 for eventual broadcast by the COFDM transmitter from an antenna 46.

To create a new 4 k mode, several elements are to be defined, but the main one is the 4 k symbol interleaver, which is part of the inner interleaver shown in FIG. 1.

Figure 2:
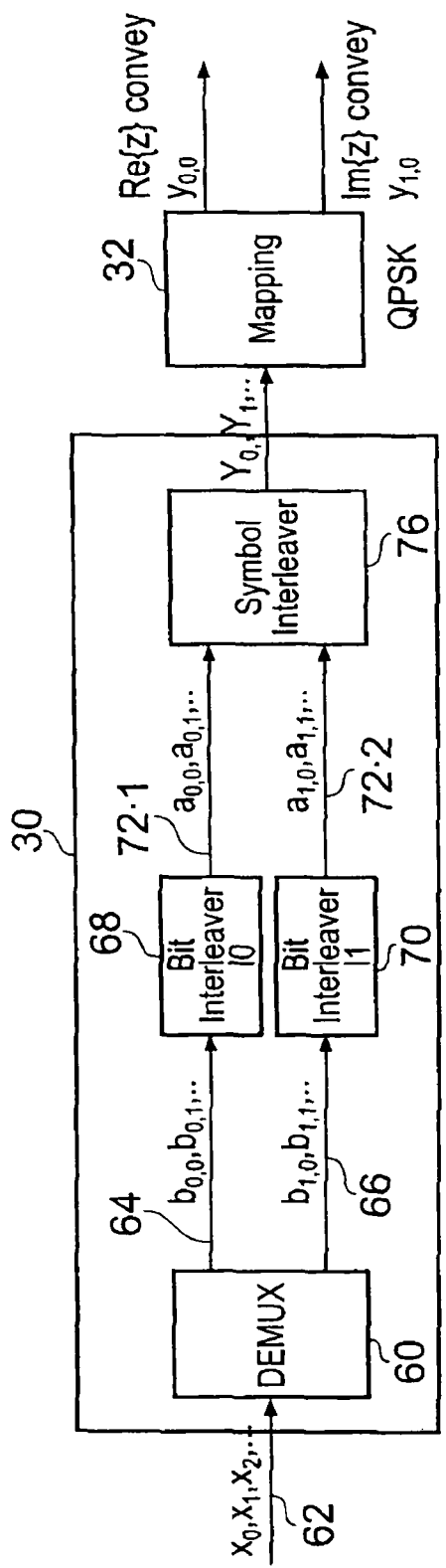
FIG. 2 is a schematic block diagram of an inner symbol interleaver and a mapping processor which appear in FIG. 1.

The inner interleaver itself is composed of a bit interleaver and a symbol interleaver as shown in FIG. 2.

As explained above, the present invention provides a facility for providing a quasi-optimal mapping of the input data symbols onto the OFDM carrier signals. According to the example technique the inner interleaver is provided to effect the optimal mapping of input data symbols onto COFDM carrier signals. The inner interleaver 30 and the mapping processor 32 are shown in FIG. 2 in more detail. In FIG. 2 the inner interleaver 30 comprises a de-multiplexing processor 60 which receives convolutionally encoded bits from an input channel 62. The de-multiplexer then divides the bits into two streams of input bits which are fed via connecting channels 64 and 66 to bit interleavers 68 and 70. The bit interleavers interleave the bits which are then formed on two connecting channels 72.1, 72.2 for connecting the bits from each of the bit interleavers 68 and 70 to a symbol interleaver 76. The symbol interleaver forms the input symbols from the connecting channels 72.1, 72.2 into symbols for mapping onto the COFDM carrier signals. For the example technique shown in FIG. 2 the interleaved symbols from the symbol interleaver 76 are mapped onto constellation points of a QPSK carrier signal for each of the signals in the COFDM symbol.

The existing DVB-T specification already defines a symbol interleaver for the 2 k and 8 k modes. The purpose of the symbol interleaver is to map v bit words (v depending on the modulation scheme chosen) onto the 1512 (2 k mode) or 6048 (8 k mode) active carriers per OFDM symbol. The symbol interleaver acts on blocks of 1512 (2 k mode) or 6048 (8 k mode) data symbols. Example embodiments of the present invention utilise the symbol interleaver 76 to provide an optimised mapping of the input data symbols fed from the connecting channels 72.1, 72.2 onto the COFDM carrier signals. An example of the symbol interleaver 76 for effecting mapping of the input data symbols onto the COFDM carrier signals is shown in FIG. 3.

Interleaver RAM

Figure 3:
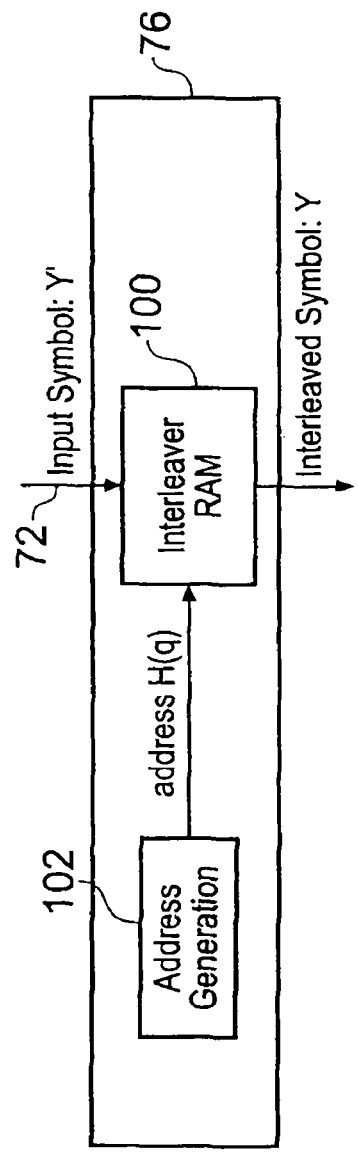
FIG. 3 is a schematic block diagram of the symbol interleaver shown in FIG. 2.

In FIG. 3 the input data symbols from the connecting channel 72 are fed to an interleaver memory 100. The interleaver memory 100 maps the input data symbols onto the COFDM carrier signals in accordance with mapping addresses provided by address generator 102. An example implementation of the interleaver memory 100 is shown in FIG. 4.

Figure 4:
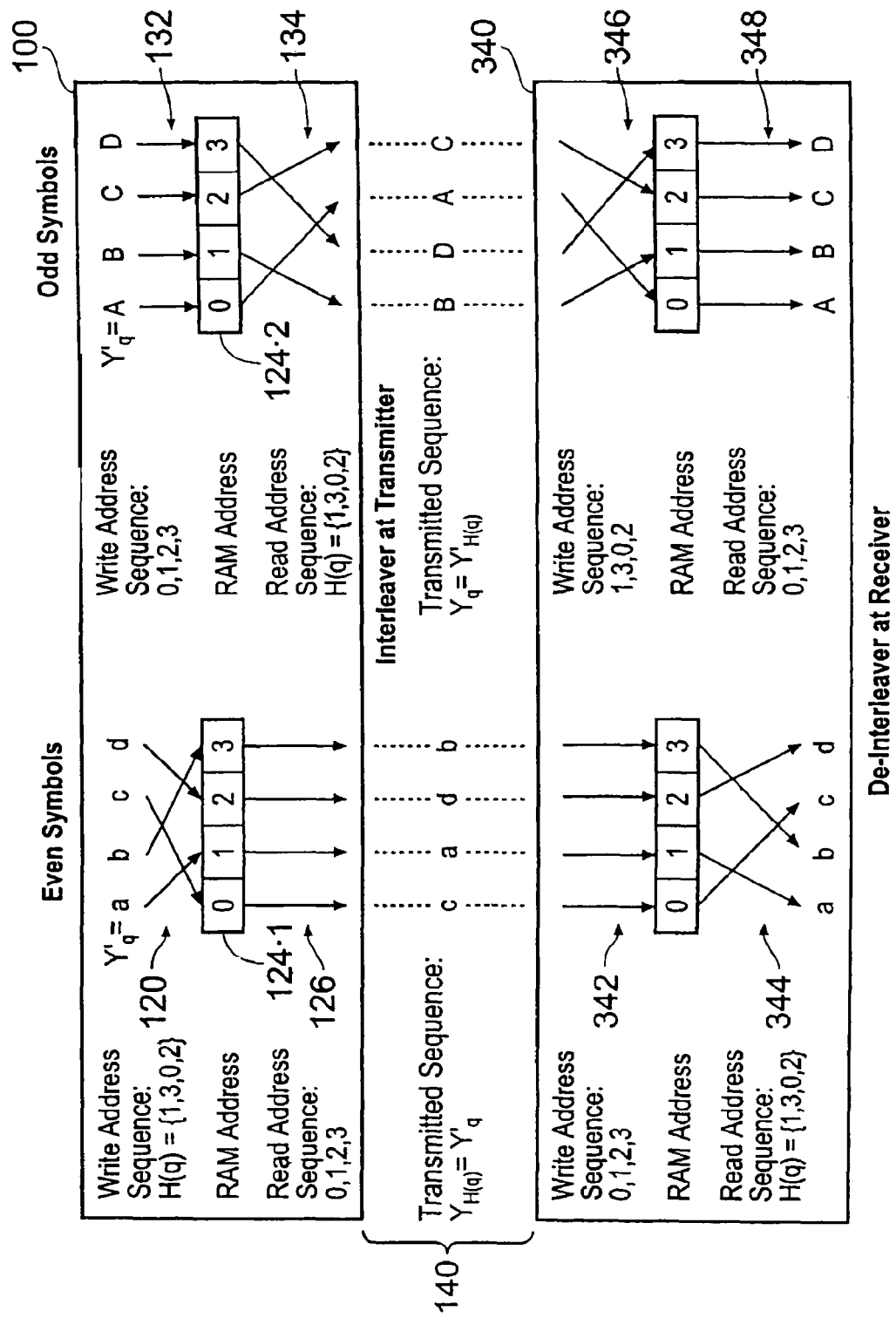
FIG. 4 is a schematic block diagram of an interleaver memory shown in FIG. 3 and the corresponding symbol de-interleaver in the receiver.

FIG. 4 comprises an upper part 100 illustrating the operation of the interleaver memory in the transmitter and a lower part 340 which illustrates the operation of the de-interleaver memory in the receiver. The interleaver 100 and the de-interleaver 340 are shown together in FIG. 4 in order to facilitate understanding of their operation. As shown in FIG. 4 a representation of the communication between the interleaver 100 and the de-interleaver 340 via other devices and via a transmission channel has been simplified and represented as a section 140 between the interleaver 100 and the de-interleaver 340. The operation of the interleaver 100 is described in the following paragraphs:

Although FIG. 4 provides an illustration of only four input data symbols onto an example of four carrier signals of a COFDM symbol, it will be appreciated that the technique illustrated in FIG. 4 can be extended to a larger number of carriers such as 1512 for the 2 k mode, 3024 for the 4 k mode and 6048 for the 8 k mode.

The input and output addressing of the interleaver memory 100 shown in FIG. 4 is shown for odd and even symbols. For an even COFDM symbol the data symbols are taken from the input channel 72 and written into the interleaver RAM 124.1 in accordance with a sequence of addresses 120 generated for each COFDM symbol by the address generator 102. The write addresses are applied for the even symbol so that as illustrated interleaving is effected by the shuffling of the write-in addresses. Therefore, for each interleaved symbol $y(h(q))=y'(q)$.

For odd symbols the same interleaver RAM 124.2 is used. However, as shown in FIG. 4 for the odd symbol the write-in order 132 is in the same address sequence used to read out the previous even symbol 126. This feature allows the odd and even symbol interleaver implementations to only use 1 RAM provided the read-out operation for a given address is performed before the write-in operation. The data symbols written into the interleaver RAM 124 during odd symbols are then read out in a sequence 134 generated by the address generator 102 for the next even COFDM symbol and so on.

In summary, as represented in FIG. 4, once the set of addresses H(q) has been calculated for all active carriers, the input vector $Y'=(y_0', y_1', y_2', \ldots, y_{Nmax-1}')$ is processed to produce the interleaved vector $Y=(y_0, y_1, y_2, \ldots, y_{Nmax-1})$ defined by:

$$y_{H(q)}=y'_q \text{ for even symbols for } q=0, \ldots, N_{max}-1$$

$$y_q=y'_{H(q)} \text{ for odd symbols for } q=0, \ldots, N_{max}-1$$

In other words, for even OFDM symbols the input words are written in a permutated way into a memory and read back in a sequential way, whereas for odd symbols, they are written sequentially and read back permutated. In the above case, the permutation H(q) is defined by the following table:

TABLE 1 permutation for simple case where Nmax = 4

| | q | | | |
|---|---|---|---|---|
| | 1 | 2 | 3 | 4 |
| H(q) | 1 | 3 | 0 | 2 |

As shown in FIG. 4, the de-interleaver 340 operates to reverse the interleaving applied by the interleaver 100, by applying the same set of addresses as generated by an equivalent address generator, but applying the write-in and read-out addresses in reverse. As such, for even symbols, the write-in addresses 342 are in sequential order, whereas the read out address 344 are provided by the address generator. Correspondingly, for the odd symbols, the write-in order 346 is determined from the set of addresses generated by the address generator, whereas read out 348 is in sequential order.

Address Generation

Figure 5:
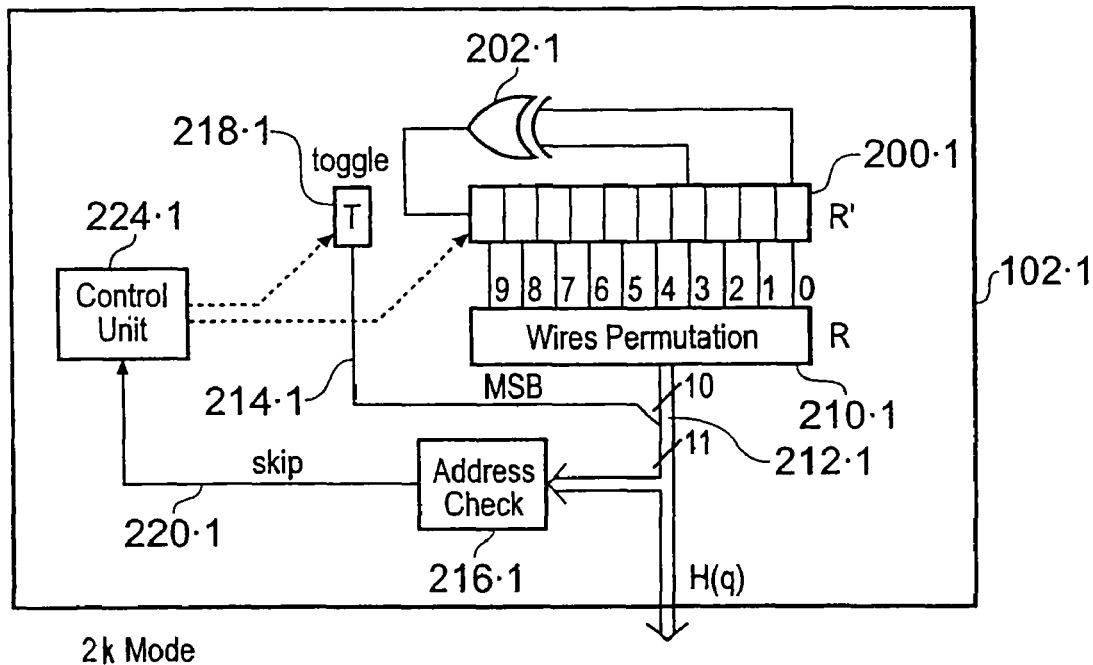
FIG. 5 is a schematic block diagram of an address generator shown in FIG. 3 for the 2 k mode.
Figure 6:
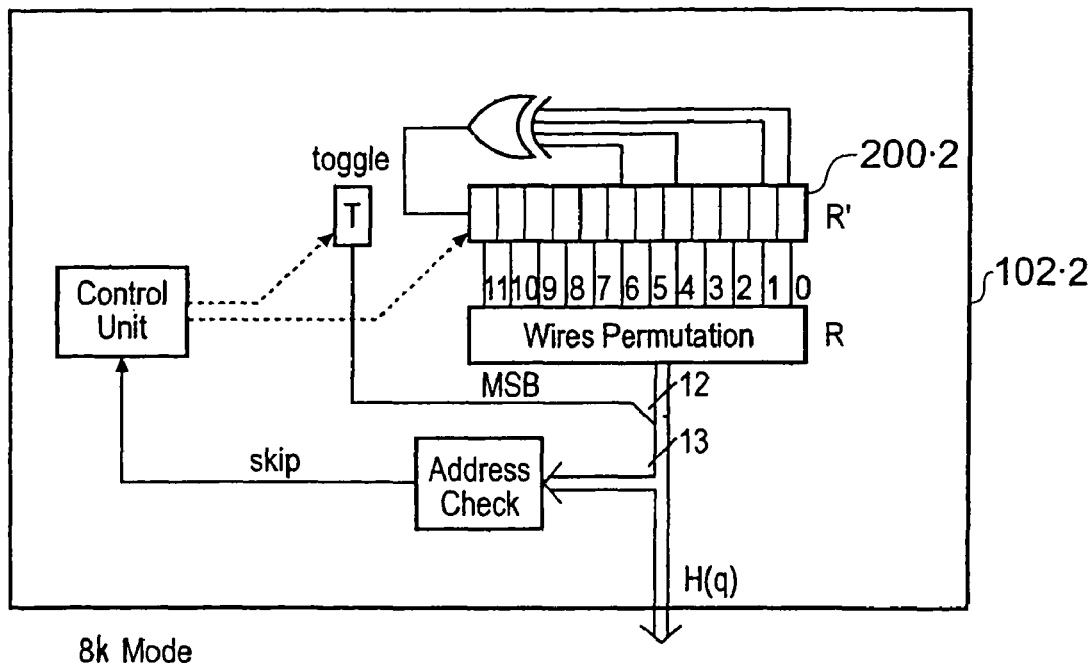
FIG. 6 is a schematic block diagram of an address generator as shown in FIG. 3 in the 8 k mode.

A schematic block diagram of the algorithm used to generate the permutation function H(q) is represented in FIG. 5 for the 2 k mode and in FIG. 6 for the 8 k mode.

An implementation of the address generator 102.1 for the 2 k mode is shown in FIG. 5. In FIG. 5 a linear feed back shift register is formed by ten register stages 200.1 and a xor-gate 202.1 which is connected to the stages of the shift register 200.1 in accordance with a generator polynomial. Therefore, in accordance with the content of the shift register 200.1 a next bit of the shift register is provided from the output of the xor-gate 202.1 by xoring the content of shift register R[0] and register stage R[3]. According to the generator polynomial a pseudo random bit sequence is generated from the content of the shift register 200.1. However, in order to generate an address for the 2 k mode as illustrated, a permutation circuit 210.1 is provided which effectively permutes the order of the bits within the shift register 200.1 from an order $R'_i[n]$ to an order $R_i[n]$ at the output of the permutation circuit 210.1. Ten bits from the output of the permutation circuit 210.1 are then fed on a connecting channel 212.1 to which is added a most significant bit via a channel 214.1 which is provided by a toggle circuit 218.1. An eleven bit address is therefore generated on channel 212.1. However, in order to ensure the authenticity of an address, an address check circuit 216.1 analyses the generated address to determine whether it exceeds the maximum number of carrier signals. If it does then a control signal is generated and fed via a connecting channel 220.1 to a control unit 224.1. If the generated address exceeds the maximum number of carrier signals then this address is rejected and a new address regenerated for the particular symbol.

An address generator 102.2 for the 8 k mode is shown in FIG. 6. The parts of the address generator for the 8 k mode shown in FIG. 6 correspond to those shown for the 2 k mode and so to avoid repetition only essential differences between FIG. 6 and FIG. 5 will be described. Essentially, the difference between FIG. 6 and FIG. 5 is that the linear feed back shift register 200.2 has twelve shift register stages in order to generate an address between 0 and 8191. Again, the shift register is formed from xoring the shift register stages selected in accordance with the generator polynomial. The address is then formed by permuting the order of the bits within the shift register 200.2 which is determined in accordance with a predetermined order. Again, the generator polynomial and the permutation order is provided for the 8 k mode which differs from the 2 k mode.

In summary for the 2 k and 8 k modes an $(N_r-1)$ bit word $R'_i$ is defined, with $N_r=\log_2 M_{max}$, where $M_{max}=2048$ in the 2 k mode and $M_{max}=8192$ in the 8 k mode, using a LFSR (Linear Feedback Shift Register).

The polynomials used to generate this sequence are as follows:

2 k mode: $R'_i[9]=R'_{i-1}[0] \oplus R'_{i-1}[3]$ 8 k mode: $R'_i[11]=R'_{i-1}[0] \oplus R'_{i-1}[1] \oplus R'_{i-1}[4] \oplus R'_{i-1}[6]$ where i varies from 0 to $M_{max}-1$ Once one $R'_i$, word has been generated, it goes through a permutation to produce another $(N_r-1)$ bit word called $R_i$. $R_i$ is derived from $R'_i$ by the bit permutations given in tables 1 and 2.

TABLE 2

Bit permutation for the 2k mode

| $R'_i$ bit positions | 9 | 8 | 7 | 6 | 5 | 4 | 3 | 2 | 1 | 1 |
|---|---|---|---|---|---|---|---|---|---|---|
| $R_i$ bit positions | 0 | 7 | 5 | 1 | 8 | 2 | 6 | 9 | 3 | 4 |

TABLE 3

Bit permutation for the 8k mode

| $R'_i$ bit positions | 11 | 10 | 9 | 8 | 7 | 6 | 5 | 4 | 3 | 2 | 1 | 0 |
|---|---|---|---|---|---|---|---|---|---|---|---|---|
| $R_i$ bit positions | 5 | 11 | 3 | 0 | 10 | 8 | 6 | 9 | 2 | 4 | 1 | 7 |

As an example, this means that for mode 2 k, the bit number 9 of $R'_i$ is sent in bit position number 0 of $R_i$.

The address H(q) is then derived from $R_i$ through the following equation:

$$H(q) = (i \bmod 2) \cdot 2^{N_r-1} + \sum_{j=0}^{N_r-2} R_i(j) \cdot 2^j$$

The $(i \bmod 2) \cdot 2^{N_r-1}$ part of the above equation is represented in FIG. 5 and in FIG. 6 by the toggle block T 218.

An address check is then performed on H(q) to verify that the generated address is within the range of acceptable addresses: if $(H(q)<N_{max})$, where $N_{max}=512$ in the 2 k mode and 6048 in the 8 k mode, then the address is valid. If the address is not valid, the control unit is informed and it will try to generate a new H(q) by incrementing the index i.

The role of the toggle block is to make sure that we do not generate an address exceeding $N_{max}$ twice in a row. In effect, if an exceeding value was generated, this means that the MSB (i.e. the toggle bit) of the address H(q) was one. So the next value generated will have a MSB set to zero, insuring to produce a valid address.

The following equations sum up the overall behaviour and help to understand the loop structure of this algorithm:

$$q = 0 \text{ for } (i = 0; i < M_{max}; i = i + 1)$$

$$\left\{ \begin{array}{l} H(q) = (i \bmod 2) \cdot 2^{N_r-1} + \sum_{j=0}^{N_r-2} R_i(j) \cdot 2^j; \\ \text{if } (H(q) < N\max) q = q + 1; \end{array} \right\}$$

Symbol Interleaver for 4 k Mode

Figure 7:
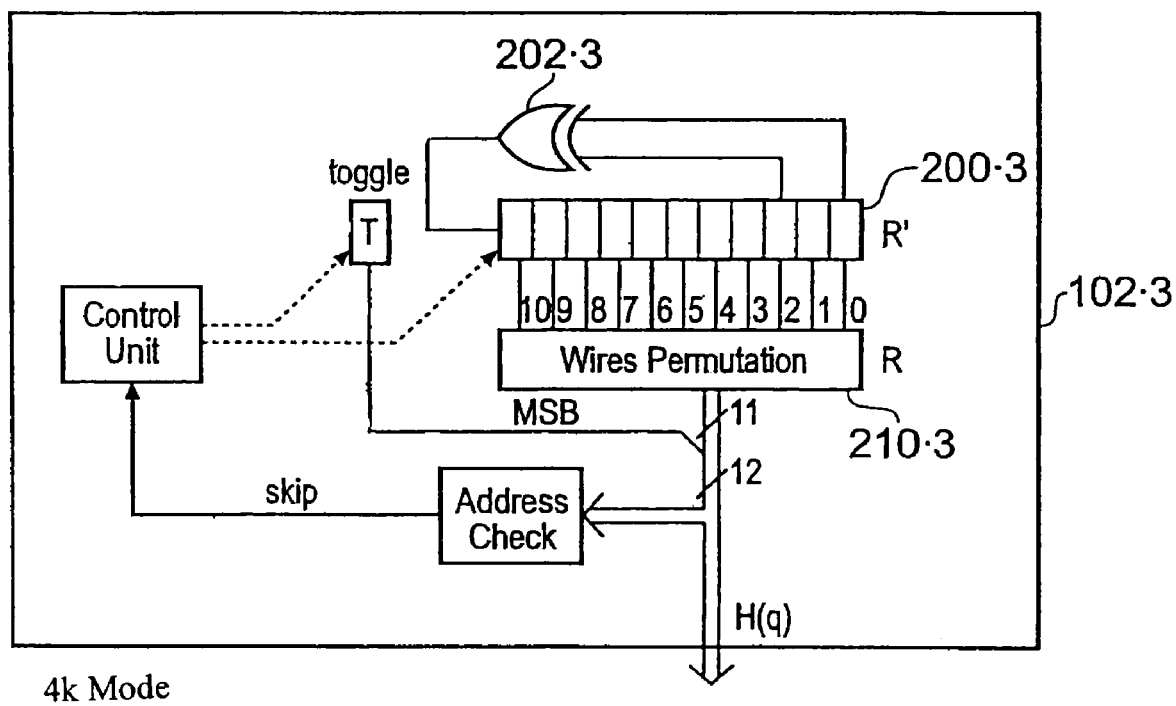
FIG. 7 is a schematic block diagram of an address generator shown in FIG. 3 in the 4 k mode.

According to the present technique an address generator 102.3 for the 4 k mode is shown in FIG. 7. Again, the address generator of FIG. 7 corresponds to the address generator shown in FIGS. 5 and 6 and so the only differences between these Figures will be discussed and explained. As shown in FIG. 7 the linear feed back shift register 200.3 has eleven shift register stages. Again, an xor-gate 202.3 is provided to generate the pseudo random bit sequence. The permutation of the contents of the shift register in order to form the address of an input data symbol for mapping onto one of the COFDM carrier signals is provided by the permutation circuit 210.3.

The symbol interleaver acts on blocks of $N_{max}=3024$ data symbols. ($M_{max}=4096$).

The polynomial used to generate the $R'_i$ sequence is:

$$R_i'[10]=R_{i-1}'[0] \oplus R_{i-1}'[2]$$

A vector $R_i$ is derived from the vector $R'_i$ by the bit permutation given in Table 4:

TABLE 4

Bit permutation for the 4k mode

| $R'_i$ bit positions | 10 | 9  | 8 | 7 | 6 | 5 | 4 | 3 | 2 | 1 | 0 |
|---|---|---|---|---|---|---|---|---|---|---|---|
| $R_i$ bit positions  | 7  | 10 | 5 | 8 | 1 | 2 | 4 | 9 | 0 | 3 | 6 |

The input of the interleaver is defined as the vector $Y'=(y_0', y_1', y_2', \ldots, y_{Nmax-1}')$.

Figure 8:
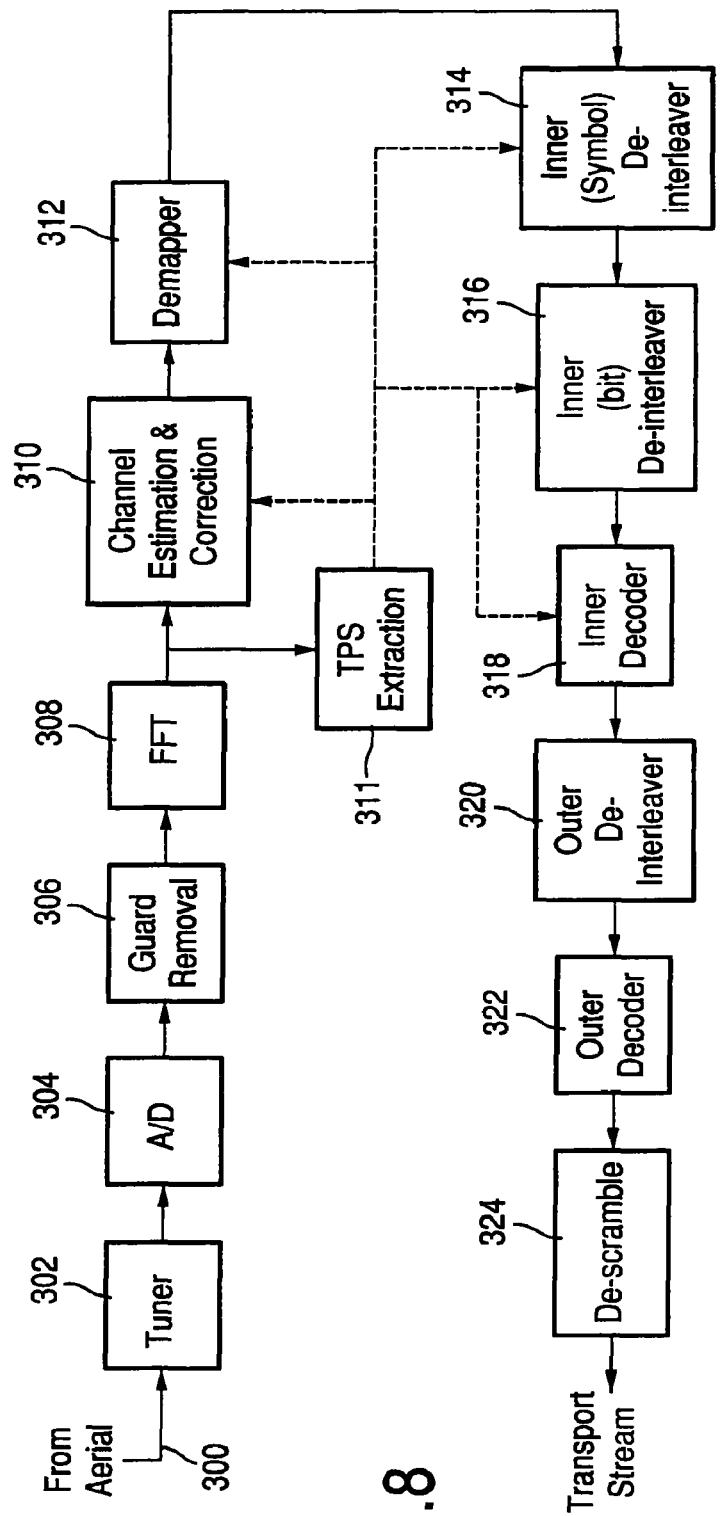
FIG. 8 is a schematic block diagram of a Coded OFDM receiver which may be used, for example, with the DVB-T standard.

The interleaved vector $Y=(y_0, y_1, y_2, \ldots, y_{Nmax}-1)$ is defined by:

$y_{H(q)}=y'_q$ for even symbols for $q=0, \ldots, N_{max}-1$ $y_q=y'_{H(q)}$ for odd symbols for $q=0, \ldots, N_{max}-1$ Receiver FIG. 8 provides an example illustration of a receiver which may be used with the present technique. As shown in FIG. 8, a COFDM signal is received by an antenna 300 and detected by a tuner 302 and converted into a digital form by an analogue-to-digital converter 304. A guard interval removal processor 306 removes the guard interval from a received COFDM symbol, before the data is recovered from the COFDM symbol using a Fast Fourier Transform (FFT) processor 308 in combination with a channel estimator and correction 310 in co-operation with a Transmission Parameter Signalling (TPS) decoding unit 311, in accordance with known techniques. The demodulated data is recovered from a de-mapper 312 and fed to an inner symbol de-interleaver 314, which operates to effect the reverse mapping of the received data symbol to re-generate an output data stream with the data de-interleaved.

Figure 9:
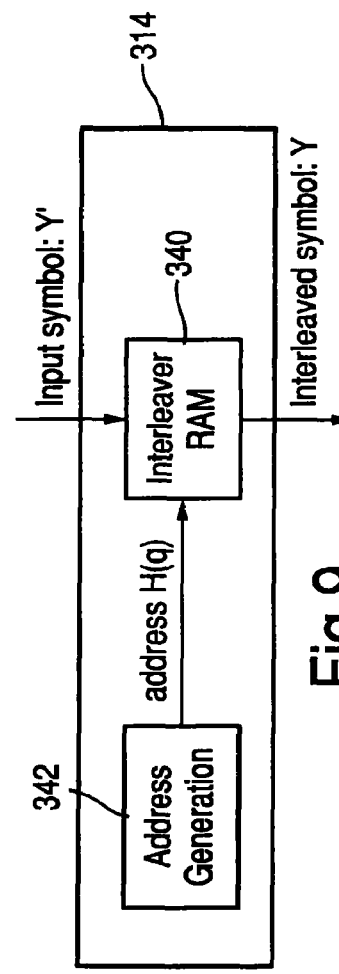
FIG. 9 is a schematic block diagram of an inner symbol de-interleaver which appears in FIG. 8.

The symbol de-interleaver 314 is formed from a data processing apparatus as shown in FIG. 9 with an interleaver memory 340 and an address generator 342. The interleaver memory is as shown in FIG. 4 and operates as already explained above to effect de-interleaving by utilising sets of addresses generated by the address generator 342. The address generator 342 is formed as shown in FIG. 7 and is arranged to generate corresponding addresses to map the data symbols recovered from each COFDM sub-carrier signals into an output data stream.

The remaining parts of the COFDM receiver shown in FIG. 8 are provided to effect error correction decoding and de-interleaving to correct errors and recover an estimate of the source data. In particular, an inner-code de-interleaver 316 and an inner-decoder 318 operate to effect decoding of the inner convolutional code introduced by the inner interleaver 30 and the inner coder 28 of the transmitter shown in FIG. 1. An outer de-interleaver 320 and an outer decoder 322 operate to effect decoding of the Reed-Solomon code to recover an estimate of the data from the source 1, after being descrambled by a descrambler 324.

One advantage provided by the present technique for both the receiver and the transmitter is that a symbol interleaver and a symbol de-interleaver operating in the receivers and transmitters can be switched between the 2 k, 8 k and the 4 k mode by changing the generator polynomials and the permutation order. A flexible implementation is thereby provided because a symbol interleaver and de-interleaver can be formed as shown in FIGS. 4 and 9, with an address generator as illustrated in either of FIG. 5, 6 or 7. The address generator can therefore be adapted to the different modes by changing to the generator polynomials and the permutation orders indicated for each of the 2 k, 4 k, and 8 k modes. For example this can be effected using a software change. Alternatively, in other embodiments, an embedded TPS signal indicating the mode of the DVB-T transmission can be detected in the receiver in the TPS channel processing unit 311 and used to configure automatically the symbol de-interleaver in accordance with the detected mode.

Various modifications may be made to the embodiments described above without departing from the scope of the present invention. In particular, the example representation of the generator polynomial and the permutation order which have been used to represent aspects of the invention are not intended to be limiting and extend to equivalent forms of the generator polynomial and the permutation order.

As will be appreciated the transmitter and receiver shown in FIGS. 1 and 8 respectively are provided as illustrations only and are not intended to be limiting. For example, it will be appreciated that the position of the symbol interleaver and the de-interleaver with respect, for example to the bit interleaver and the mapper and de-mapper can be changed. As will be appreciated the effect of the interleaver and de-interleaver is un-changed by its relative position, although the interleaver may be interleaving I/Q symbols instead of v-bit vectors. A corresponding change may be made in the receiver. Accordingly the interleaver and de-interleaver may be operating on different data types, and may be positioned differently to the position described in the example embodiments.

As mentioned above, embodiments of the present invention find application with DVB standards such as DVB-T and DVB-H, which are incorporated herein by reference. For example embodiments of the present invention may be used in a transmitter or receiver operating in accordance with the DVB-H standard, in hand-held mobile terminals. The mobile terminals may be integrated with mobile telephones (whether second, third or higher generation) or Personal Digital Assistants or Tablet PCs for example. Such mobile terminals may be capable of receiving DVB-H or DVB-T compatible signals inside buildings or on the move in for example cars or trains, even at high speeds. The mobile terminals may be, for example, powered by batteries, mains electricity or low voltage DC supply or powered from a car battery. Services that may be provided by DVB-H may include voice, messaging, internet browsing, radio, still and/or moving video images, television services, interactive services, video or near-video on demand and option. The services might operate in combination with one another. It will be appreciated that the present invention is not limited to application with DVB and may be extended to other standards for transmission or reception, both fixed and mobile.

REFERENCES

[1] EN 300 744, "Framing structure, channel coding and modulation for digital terrestrial television", ETSI.

The invention claimed is:

1. A data processing apparatus configured to map input symbols to be communicated onto a predetermined number of carrier signals of an Orthogonal Frequency Division Multiplexed (OFDM) symbol, the data processing apparatus comprising:
   an interleaver memory configured to read-in a predetermined number of data symbols for mapping onto the OFDM carrier signals, and to read-out the data symbols for the OFDM carriers to effect the mapping, the read-out being in a different order than the read-in, the order being determined from a set of addresses, with the effect that the data symbols are interleaved on the carrier signals; and an address generator configured to generate the set of addresses, an address being generated for each of the input symbols to indicate one of the carrier signals onto which the data symbol is to be mapped, the address generator including a linear feedback shift register including a predetermined number of register stages and being configured to generate a pseudo-random bit sequence in accordance with a generator polynomial;

a permutation circuit configured to receive the content of the shift register stages and to permute the bits present in the register stages in accordance with a permutation order to form an address of one of the OFDM carriers; and a control unit configured in combination with an address check circuit to re-generate an address when a generated address exceeds the predetermined number of carriers, wherein the predetermined number of OFDM carrier signals is a maximum of four thousand and ninety six, the linear feedback shift register has eleven register stages with a generator polynomial for the linear feedback shift register of $R'_i[10]=R'_{i-1}[0] \oplus R'_{i-1}[2]$, and the permutation order forms, with an additional bit, a twelve bit address, which includes an eleven bit address $R_i[n]$ for the i-th data symbol from the bit present in the n-th register stage $R'_i[n]$ in accordance with the table:

| $R'_i[n]$ for n = | 10 | 9  | 8 | 7 | 6 | 5 | 4 | 3 | 2 | 1 | 0 |
|---|---|---|---|---|---|---|---|---|---|---|---|
| $R_i[n]$ for n =  |    | 7  | 10| 5 | 8 | 1 | 2 | 4 | 9 | 0 | 3 | 6 | and the additional bit is the most significant bit of the address, the value of the additional bit being toggled between 0 and 1 between successive OFDM symbols.

2. A data processing apparatus as claimed in claim 1, wherein the interleaver memory is configured to effect the mapping of the input data symbols onto the carrier signals for even OFDM symbols by reading in the data symbols according to the set of addresses generated by the address generator and reading out in a sequential order, and for odd OFDM symbols by reading in the symbols into the memory in a sequential order and reading out the data symbols from the memory in accordance with the set of addresses generated by the address generator.

3. A transmitter for transmitting data using Orthogonal Frequency Division Multiplexing (OFDM), the transmitter including a data processing apparatus according to claim 1.

4. The transmitter as claimed in claim 3, wherein the transmitter is configured to transmit data in accordance with the Digital Video Broadcasting-Terrestrial or Digital Video Broadcasting-Handheld standard.

5. A data processing apparatus configured to de-map symbols received from a predetermined number of carrier signals of an Orthogonal Frequency Division Multiplexed (OFDM) symbol into an output symbol stream, the data processing apparatus comprising:

a de-interleaver memory configured to read-in a predetermined number of data symbols from the OFDM carrier signals, and to read-out the data symbols into the output symbol stream to effect the de-mapping, the read-out being in a different order than the read-in, the order being determined from a set of addresses, with the effect that the data symbols are de-interleaved from the OFDM carrier signals; and an address generator configured to generate the set of addresses, an address being generated for each of the received data symbols to indicate the OFDM carrier signal from which the received data symbol is to be de-mapped into the output symbol stream, the address generator including a linear feedback shift register including a predetermined number of register stages and being configured to generate a pseudo-random bit sequence in accordance with a generator polynomial;

a permutation circuit configured to receive the content of the shift register stages and to permute the bits present in the register stages in accordance with a permutation order to form an address of one of the OFDM carriers; and a control unit configured in combination with an address check circuit to re-generate an address when a generated address exceeds the predetermined number of carriers, wherein the predetermined number of OFDM carrier signals is a maximum of four thousand and ninety six, the linear feedback shift register has eleven register stages with a generator polynomial for the linear feedback shift register of $R'_i[10]=R'_{i-1}[0] \oplus R'_{i-1}[2]$, and the permutation order forms, with an additional bit, a twelve bit address, which includes an eleven bit address $R_i[n]$ for the i-th data symbol from the bit present in the n-th register stage $R'_i[n]$ in accordance with the table:

| $R'_i[n]$ for n = | 10 | 9  | 8 | 7 | 6 | 5 | 4 | 3 | 2 | 1 | 0 |
|---|---|---|---|---|---|---|---|---|---|---|---|
| $R_i[n]$ for n =  |    | 7  | 10| 5 | 8 | 1 | 2 | 4 | 9 | 0 | 3 | 6 | and the additional bit is the most significant bit of the address, the value of the additional bit being toggled between 0 and 1 between successive OFDM symbols.

6. The data processing apparatus as claimed in claim 5, wherein the de-interleaver memory is arranged to effect the de-mapping of the received data symbols from the carrier signals onto the output data stream for even OFDM symbols by reading in the data symbols according to a sequential order and reading out the data symbols from memory according to the set of addresses generated by the address generator, and for odd OFDM symbols by reading in the symbols into the memory in accordance with the set of addresses generated by the address generator and reading out the data symbols from the memory in accordance with a sequential order.

7. The receiver for receiving data from Orthogonal Frequency Division Multiplexing (OFDM) modulated signal, the receiver including a data processing apparatus according to claim 6.

8. The receiver as claimed in claim 7, wherein the receiver is configured to receive data which has been modulated in accordance with the Digital Video Broadcasting-Terrestrial or Handheld standard.

9. A method of mapping input symbols to be communicated onto a predetermined number of carrier signals of an Orthogonal Frequency Division Multiplexed (OFDM) symbol, the method comprising:

reading-in a predetermined number of data symbols for mapping onto the OFDM carrier signals;

reading-out the data symbols for the OFDM carriers to effect the mapping, the read-out being in a different order than the read-in, the order being determined from a set of addresses, with the effect that the data symbols are interleaved on the carrier signals; and generating the set of addresses, an address being generated for each of the input symbols to indicate one of the carrier signals onto which the data symbol is to be mapped, the step of generating the set of addresses including using a linear feedback shift register including a predetermined number of register stages to generate a pseudo-random bit sequence in accordance with a generator polynomial;

using a permutation circuit configured to receive the content of the shift register stages to permute the bits present in the register stages in accordance with a permutation order to form an address of one of the of OFDM carriers; and re-generating an address when a generated address exceeds the predetermined number of carriers, wherein the predetermined number of OFDM carrier signals is a maximum of four thousand and ninety six, the linear feedback shift register has eleven register stages with a generator polynomial for the linear feedback shift register of $R'_i[10]=R'_{i-1}[0]\oplus R'_{i-1}[2]$, and the permutation order forms, with an additional bit, a twelve bit address, which includes an eleven bit address $R_i[n]$ for the i-th data symbol from the bit present in the n-th register stage $R'_i[n]$ in accordance with the table:

| $R'_i[n]$ for n = | 10 | 9 | 8 | 7 | 6 | 5 | 4 | 3 | 2 | 1 | 0 |
|---|---|---|---|---|---|---|---|---|---|---|---|
| $R_i[n]$ for n = | 7 | 10 | 5 | 8 | 1 | 2 | 4 | 9 | 0 | 3 | 6 | and the additional bit is the most significant bit of the address, the value of the additional bit being toggled between 0 and 1 between successive OFDM symbols.

10. A method of de-mapping symbols received from a predetermined number of carrier signals of an Orthogonal Frequency Division Multiplexed (OFDM) symbol into an output symbol stream, the method comprising:

reading-in a predetermined number of data symbols from the OFDM carrier signals;

reading-out the data symbols into the output symbol stream to effect the de-mapping, the read-out being in a different order than the read-in, the order being determined from a set of addresses, with the effect that the data symbols are de-interleaved from the OFDM carrier signals; and generating the set of addresses, an address being generated for each of the received symbols to indicate the OFDM carrier signal from which the received data symbol is to be de-mapped into the output symbol stream, the step of generating the set of addresses including using a linear feedback shift register including a predetermined number of register stages to generate a pseudo-random bit sequence in accordance with a generator polynomial;

using a permutation circuit to receive the content of the shift register stages and to permute the bits present in the register stages in accordance with a permutation order to form an address of one of the OFDM carriers; and re-generating an address when a generated address exceeds the predetermined number of carriers, wherein the predetermined number of OFDM carrier signals is a maximum of four thousand and ninety six, the linear feedback shift register has eleven register stages with a generator polynomial for the linear feedback shift register of $R'_i[10]=R'_{i-1}[0]\oplus R'_{i-1}[2]$, and the permutation order forms, with an additional bit, a twelve bit address, which includes an eleven bit address $R_i[n]$ for the i-th data symbol from the bit present in the n-th register stage $R'_i[n]$ in accordance with the table:

| $R'_i[n]$ for n = | 10 | 9 | 8 | 7 | 6 | 5 | 4 | 3 | 2 | 1 | 0 |
|---|---|---|---|---|---|---|---|---|---|---|---|
| $R_i[n]$ for n = | 7 | 10 | 5 | 8 | 1 | 2 | 4 | 9 | 0 | 3 | 6 | and the additional bit is the most significant bit of the address, the value of the additional bit being toggled between 0 and 1 between successive OFDM symbols.

11. An address generator for use with transmission or reception of data symbols interleaved onto a maximum of four thousand and ninety six carriers of an Orthogonal Frequency Division Multiplexed symbol, the address generator being configured to generate a set of addresses, each address being generated for each of the data symbols to indicate one of the carrier signals onto which the data symbol is to be mapped or de-mapped, the address generator comprising:

a linear feedback shift register including a predetermined number of register stages and being configured to generate a pseudo-random bit sequence in accordance with a generator polynomial;

a permutation circuit configured to receive the content of the shift register stages and to permute the bits present in the register stages in accordance with a permutation order to form an address of one of the OFDM carriers; and a control unit configured in combination with an address check circuit to re-generate an address when a generated address exceeds the predetermined number of carriers, wherein the linear feedback shift register has eleven register stages with a generator polynomial for the linear feedback shift register of $R'_i[10]=R'_{i-1}[0]\oplus R'_{i-1}[2]$, and the permutation order forms, with an additional bit, a twelve bit address, which includes an eleven bit address $R_i[n]$ for the i-th data symbol from the bit present in the n-th register stage $R'_i[n]$ in accordance with the table:

| $R'_i[n]$ for n = | 10 | 9 | 8 | 7 | 6 | 5 | 4 | 3 | 2 | 1 | 0 |
|---|---|---|---|---|---|---|---|---|---|---|---|
| $R_i[n]$ for n = | 7 | 10 | 5 | 8 | 1 | 2 | 4 | 9 | 0 | 3 | 6 | and the additional bit is the most significant bit of the address, the value of the additional bit being toggled between 0 and 1 between successive OFDM symbols.

12. A data processing apparatus configured to map input symbols to be communicated onto a predetermined number of carrier signals of an Orthogonal Frequency Division Multiplexed (OFDM) symbol, the data processing apparatus comprising:

an interleaver memory configured to read-in a predetermined number of data symbols for mapping onto the OFDM carrier signals, and to read-out the data symbols for the OFDM carriers to effect the mapping, the read-out being in a different order than the read-in, the order being determined from a set of addresses, with the effect that the data symbols are interleaved on the carrier signals; and an address generator configured to generate the set of addresses, an address being generated for each of the input symbols to indicate one of the carrier signals onto which the data symbol is to be mapped, the address generator including a linear feedback shift register including a predetermined number of register stages and being configured to generate a pseudo-random bit sequence in accordance with a generator polynomial;

a permutation circuit configured to receive the content of the shift register stages and to permute the bits present in the register stages in accordance with a permutation order to form an address of one of the OFDM carriers; and a control unit configured in combination with an address check circuit to re-generate an address when a generated address exceeds a maximum valid address determined by the predetermined number of carriers, wherein the predetermined number of OFDM carrier signals is a maximum of four thousand and ninety six, the linear feedback shift register has eleven register stages with a generator polynomial for the linear feedback shift register of $R'_i[10]=R'_{i-1}[0] \oplus R'_{i-1}[2]$, and the permutation order forms an eleven bit address $R_i[n]$ for the i-th data symbol from the bit present in the n-th register stage $R'_i[n]$ in accordance with the table:

| $R'_i[n]$ for n = | 10 | 9 | 8 | 7 | 6 | 5 | 4 | 3 | 2 | 1 | 0 |
|---|---|---|---|---|---|---|---|---|---|---|---|
| $R_i[n]$ for n = | 7 | 10 | 5 | 8 | 1 | 2 | 4 | 9 | 0 | 3 | 6. |

13. The data processing apparatus according to claim 12, wherein the interleaver memory is configured to effect the mapping of the input data symbols onto the carrier signals for even OFDM symbols by reading in the data symbols according to the set of addresses generated by the address generator and reading out in a sequential order, and for odd OFDM symbols by reading in the symbols into the memory in a sequential order and reading out the data symbols from the memory in accordance with the set of addresses generated by the address generator.

14. A transmitter for transmitting data using Orthogonal Frequency Division Multiplexing (OFDM), the transmitter including a data processing apparatus according to claim 12.

15. The transmitter as claimed in claim 14, wherein the transmitter is configured to transmit data in accordance with the Digital Video Broadcasting-Terrestrial or Digital Video Broadcasting-Handheld standard.

16. A data processing apparatus configured to de-map symbols received from a predetermined number of carrier signals of an Orthogonal Frequency Division Multiplexed (OFDM) symbol into an output symbol stream, the data processing apparatus comprising:

a de-interleaver memory configured to read-in a predetermined number of data symbols from the OFDM carrier signals, and to read-out the data symbols into the output symbol stream to effect the de-mapping, the read-out being in a different order than the read-in, the order being determined from a set of addresses, with the effect that the data symbols are de-interleaved from the OFDM carrier signals; and an address generator configured to generate the set of addresses, an address being generated for each of the received data symbols to indicate the OFDM carrier signal from which the received data symbol is to be de-mapped into the output symbol stream, the address generator including a linear feedback shift register including a predetermined number of register stages and being configured to generate a pseudo-random bit sequence in accordance with a generator polynomial;

a permutation circuit configured to receive the content of the shift register stages and to permute the bits present in the register stages in accordance with a permutation order to form an address of one of the OFDM carriers; and a control unit configured in combination with an address check circuit to re-generate an address when a generated address exceeds a maximum valid address determined by the predetermined number of carriers, wherein the predetermined number of OFDM carrier signals is a maximum of four thousand and ninety six, the linear feedback shift register has eleven register stages with a generator polynomial for the linear feedback shift register of $R'_i[10]=R'_{i-1}[0] \oplus R'_{i-1}[2]$, and the permutation order forms an eleven bit address $R_i[n]$ for the i-th data symbol from the bit present in the n-th register stage $R'_i[n]$ in accordance with the table:

| $R'_i[n]$ for n = | 10 | 9 | 8 | 7 | 6 | 5 | 4 | 3 | 2 | 1 | 0 |
|---|---|---|---|---|---|---|---|---|---|---|---|
| $R_i[n]$ for n = | 7 | 10 | 5 | 8 | 1 | 2 | 4 | 9 | 0 | 3 | 6. |

17. The data processing apparatus as claimed in claim 16, wherein the de-interleaver memory is configured to effect the de-mapping of the received data symbols from the carrier signals onto the output data stream for even OFDM symbols by reading in the data symbols according to a sequential order and reading out the data symbols from memory according to the set of addresses generated by the address generator, and for odd OFDM symbols by reading in the symbols into the memory in accordance with the set of addresses generated by the address generator and reading out the data symbols from the memory in accordance with a sequential order.

18. A receiver for receiving data from Orthogonal Frequency Division Multiplexing (OFDM) modulated signal, the receiver including a data processing apparatus according to claim 16.

19. The receiver according to claim 18, wherein the receiver is configured to receive data which has been modulated in accordance with the Digital Video Broadcasting-Terrestrial or Handheld standard.

20. A method of mapping input symbols to be communicated onto a predetermined number of carrier signals of an Orthogonal Frequency Division Multiplexed (OFDM) symbol, the method comprising:

reading-in a predetermined number of data symbols for mapping onto the OFDM carrier signals;

reading-out the data symbols for the OFDM carriers to effect the mapping, the read-out being in a different order than the read-in, the order being determined from a set of addresses, with the effect that the data symbols are interleaved on the carrier signals; and generating the set of addresses, an address being generated for each of the input symbols to indicate one of the carrier signals onto which the data symbol is to be mapped, the step of generating the set of addresses including using a linear feedback shift register including a predetermined number of register stages to generate a pseudo-random bit sequence in accordance with a generator polynomial;

using a permutation circuit configured to receive the content of the shift register stages to permute the bits present in the register stages in accordance with a permutation order to form an address of one of the of OFDM carriers; and re-generating an address when a generated address exceeds a maximum valid address determined by the predetermined number of carriers, wherein the predetermined number of OFDM carrier signals is a maximum of four thousand and ninety six, the linear feedback shift register has eleven register stages with a generator polynomial for the linear feedback shift register of $R'_i[10]=R'_{i-1}[0] \oplus R'_{i-1}[2]$, and the permutation order forms an eleven bit address $R_i[n]$ for the i-th data symbol from the bit present in the n-th register stage $R'_i[n]$ in accordance with the table:

| $R'_i[n]$ for n = | 10 | 9 | 8 | 7 | 6 | 5 | 4 | 3 | 2 | 1 | 0 |
|---|---|---|---|---|---|---|---|---|---|---|---|
| $R_i[n]$ for n = |  | 7 | 10 | 5 | 8 | 1 | 2 | 4 | 9 | 0 | 3 | 6. |

21. A method of de-mapping symbols received from a predetermined number of carrier signals of an Orthogonal Frequency Division Multiplexed (OFDM) symbol into an output symbol stream, the method comprising:

reading-in a predetermined number of data symbols from the OFDM carrier signals;

reading-out the data symbols into the output symbol stream to effect the de-mapping, the read-out being in a different order than the read-in, the order being determined from a set of addresses, with the effect that the data symbols are de-interleaved from the OFDM carrier signals; and generating the set of addresses, an address being generated for each of the received symbols to indicate the OFDM carrier signal from which the received data symbol is to be de-mapped into the output symbol stream, the step of generating the set of addresses including using a linear feedback shift register including a predetermined number of register stages to generate a pseudo-random bit sequence in accordance with a generator polynomial;

using a permutation circuit to receive the content of the shift register stages and to permute the bits present in the register stages in accordance with a permutation order to form an address of one of the OFDM carriers; and re-generating an address when a generated address exceeds a maximum valid address determined by the predetermined number of carriers, wherein the predetermined number of OFDM carrier signals is a maximum of four thousand and ninety six, the linear feedback shift register has eleven register stages with a generator polynomial for the linear feedback shift register of $R'_i[10]=R'_{i-1}[0] \oplus R'_{i-1}[2]$, and the permutation order forms an eleven bit address $R_i[n]$ for the i-th data symbol from the bit present in the n-th register stage $R'_i[n]$ in accordance with the table:

| $R'_i[n]$ for n = | 10 | 9 | 8 | 7 | 6 | 5 | 4 | 3 | 2 | 1 | 0 |
|---|---|---|---|---|---|---|---|---|---|---|---|
| $R_i[n]$ for n = |  | 7 | 10 | 5 | 8 | 1 | 2 | 4 | 9 | 0 | 3 | 6. |

22. An address generator for use with transmission or reception of data symbols interleaved onto a predetermined number of carrier signals of an Orthogonal Frequency Division Multiplexed symbol, the address generator being configured to generate a set of addresses, each address being generated for each of the data symbols to indicate one of the carrier signals onto which the data symbol is to be mapped or de-mapped, the address generator comprising:

a linear feedback shift register including a predetermined number of register stages and being configured to generate a pseudo-random bit sequence in accordance with a generator polynomial;

a permutation circuit configured to receive the content of the shift register stages and to permute the bits present in the register stages in accordance with a permutation order to form an address of one of the OFDM carriers; and a control unit configured in combination with an address check circuit to re-generate an address when a generated address exceeds a maximum valid address determined by the predetermined number of carriers, wherein the predetermined number of OFDM carrier signals is a maximum of four thousand and ninety six, the linear feedback shift register has eleven register stages with a generator polynomial for the linear feedback shift register of $R'_i[10]=R'_{i-1}[0] \oplus R'_{i-1}[2]$, and the permutation order forms an eleven bit address $R_i[n]$ for the i-th data symbol from the bit present in the n-th register stage $R'_i[n]$ in accordance with the table:

| $R'_i[n]$ for n = | 10 | 9 | 8 | 7 | 6 | 5 | 4 | 3 | 2 | 1 | 0 |
|---|---|---|---|---|---|---|---|---|---|---|---|
| $R_i[n]$ for n = |  | 7 | 10 | 5 | 8 | 1 | 2 | 4 | 9 | 0 | 3 | 6. |

23. A transmitter for transmitting data using Orthogonal Frequency Division Multiplexing, OFDM, the transmitter including a data processing apparatus configured to map input symbols to be communicated onto a predetermined number of carrier signals of an Orthogonal Frequency Division Multiplexed OFDM symbol, in accordance with a plurality of different operating modes, each of which provides a different number of OFDM carriers, the data processing apparatus comprising:

an interleaver memory configured to read-in a predetermined number of data symbols for mapping onto the OFDM carrier signals, and to read-out the data symbols for the OFDM carriers to effect the mapping, the read-out being in a different order than the read-in, the order being determined from a set of addresses, with the effect that the data symbols are interleaved on the carrier signals; and an address generator configured to generate the set of addresses, an address being generated for each of the input symbols to indicate one of the carrier signals onto which the data symbol is to be mapped, the address generator including a linear feedback shift register including a predetermined number of register stages and being configured to generate a pseudo-random bit sequence in accordance with a generator polynomial;

a permutation circuit configured to receive the content of the shift register stages and to permute the bits present in the register stages in accordance with a permutation order to form an address of one of the OFDM carriers; and a control unit configured in combination with an address check circuit to re-generate an address when a generated address exceeds the predetermined number of carriers, wherein the transmitter can be switched between 2k, 4k and 8k operating modes, and for the 4k mode, the predetermined number of OFDM carrier signals is a maximum of four thousand and ninety six, the linear feedback shift register has eleven register stages with a generator polynomial for the linear feedback shift register of $R'_i[10]=R'_{i-1}[0] \oplus R'_{i-1}[2]$, and the permutation order forms an eleven bit address $R_i[n]$ for the i-th data symbol from the bit present in the n-th register stage $R'_i[n]$ in accordance with the table:

| $R'_i[n]$ for n = | 10 | 9 | 8 | 7 | 6 | 5 | 4 | 3 | 2 | 1 | 0 |
|---|---|---|---|---|---|---|---|---|---|---|---|
| $R_i[n]$ for n = | 7 | 10 | 5 | 8 | 1 | 2 | 4 | 9 | 0 | 3 | 6. |

24. The data transmitter as claimed in claim 23, wherein the interleaver memory is configured to effect the mapping of the input data symbols onto the carrier signals for even OFDM symbols by reading in the data symbols according to the set of addresses generated by the address generator and reading out in a sequential order, and for odd OFDM symbols by reading in the symbols into the memory in a sequential order and reading out the data symbols from the memory in accordance with the set of addresses generated by the address generator.

25. The transmitter as claimed in claim 23, wherein the transmitter is configured to transmit data in accordance with the Digital Video Broadcasting-Terrestrial or Digital Video Broadcasting-Handheld standard.

26. A receiver for receiving data from Orthogonal Frequency Division Multiplexing (OFDM) modulated signal, the receiver including a data processing apparatus configured to map symbols received from a predetermined number of carrier signals of an Orthogonal Frequency Division Multiplexed, OFDM, symbol into an output symbol stream in accordance with a plurality of different operating modes, each of which provides a different number of OFDM carriers, the data processing apparatus comprising:

a de-interleaver memory configured to read-in a predetermined number of data symbols from the OFDM carrier signals, and to read-out the data symbols into the output symbol stream to effect the mapping, the read-out being in a different order than the read-in, the order being determined from a set of addresses, with the effect that the data symbols are de-interleaved from the OFDM carrier signals; and an address generator configured to generate the set of addresses, an address being generated for each of the received data symbols to indicate the OFDM carrier signal from which the received data symbol is to be mapped into the output symbol stream, the address generator including a linear feedback shift register including a predetermined number of register stages and being configured to generate a pseudo-random bit sequence in accordance with a generator polynomial;

a permutation circuit configured to receive the content of the shift register stages and to permute the bits present in the register stages in accordance with a permutation order to form an address of one of the OFDM carriers; and a control unit configured in combination with an address check circuit to re-generate an address when a generated address exceeds the predetermined number of carriers, wherein the receiver can be switched between 2k, 4k and 8k operating modes, and for the 4k mode, the predetermined number of OFDM carrier signals is a maximum of four thousand and ninety six, the linear feedback shift register has eleven register stages with a generator polynomial for the linear feedback shift register of $R'_i[10]=R'_{i-1}[0] \oplus R'_{i-1}[2]$, and the permutation order forms an eleven bit address $R_i[n]$ for the i-th data symbol from the bit present in the n-th register stage $R'_i[n]$ in accordance with the table:

| $R'_i[n]$ for n = | 10 | 9 | 8 | 7 | 6 | 5 | 4 | 3 | 2 | 1 | 0 |
|---|---|---|---|---|---|---|---|---|---|---|---|
| $R_i[n]$ for n = | 7 | 10 | 5 | 8 | 1 | 2 | 4 | 9 | 0 | 3 | 6. |

27. The receiver as claimed in claim 26, wherein the de-interleaver memory is arranged to effect the mapping of the received data symbols from the carrier signals onto the output data stream for even OFDM symbols by reading in the data symbols according to a sequential order and reading out the data symbols from memory according to the set of addresses generated by the address generator, and for odd OFDM symbols by reading in the symbols into the memory in accordance with the set of addresses generated by the address generator and reading out the data symbols from the memory in accordance with a sequential order.

28. The receiver as claimed in claim 27, wherein the receiver is configured to receive data which has been modulated in accordance with the Digital Video Broadcasting-Terrestrial or Handheld standard.

29. A method of transmitting data using Orthogonal Frequency Division Multiplexing OFDM, comprising mapping input symbols to be communicated onto a predetermined number of carrier signals of an Orthogonal Frequency Division Multiplexed, OFDM, symbol, in accordance with a plurality of different operating modes, each of which provides a different number of OFDM carriers, the mapping comprising:

reading-in a predetermined number of data symbols for mapping onto the OFDM carrier signals;

reading-out the data symbols for the OFDM carriers to effect the mapping, the read-out being in a different order than the read-in, the order being determined from a set of addresses, with the effect that the data symbols are interleaved on the carrier signals; and generating the set of addresses, an address being generated for each of the input symbols to indicate one of the carrier signals onto which the data symbol is to be mapped, the step of generating the set of addresses including using a linear feedback shift register including a predetermined number of register stages to generate a pseudo-random bit sequence in accordance with a generator polynomial;

using a permutation circuit configured to receive the content of the shift register stages to permute the bits present in the register stages in accordance with a permutation order to form an address; and re-generating an address when a generated address exceeds the predetermined number of carriers, wherein by switching from a 2k operating mode, or an 8k operating mode to a 4k operating mode, the predetermined number of OFDM carrier signals is a maximum of four thousand and ninety six, the linear feedback shift register has eleven register stages with a generator polynomial for the linear feedback shift register of $R'_i[10]=R'_{i-1}[0]\oplus R'_{i-1}[2]$, and the permutation order forms an eleven bit address $R_i[n]$ for the i-th data symbol from the bit present in the n-th register stage $R'_i[n]$ in accordance with the table:

| $R'_i[n]$ for n = | 10 | 9 | 8 | 7 | 6 | 5 | 4 | 3 | 2 | 1 | 0 |
|---|---|---|---|---|---|---|---|---|---|---|---|
| $R_i[n]$ for n = | 7 | 10 | 5 | 8 | 1 | 2 | 4 | 9 | 0 | 3 | 6. |

30. A method of receiving data using Orthogonal Frequency Division Mutiplexing OFDM, comprising mapping symbols received from a predetermined number of carrier signals of an Orthogonal Frequency Division Multiplexed OFDM symbol into an output symbol stream, in accordance with a plurality of different operating modes, each of which provides a different number of OFDM carries, the mapping comprising:

reading-in a predetermined number of data symbols from the OFDM carrier signals;

reading-out the data symbols into the output symbol stream to effect the mapping, the read-out being in a different order than the read-in, the order being determined from a set of addresses, with the effect that the data symbols are de-interleaved from the OFDM carrier signals; and generating the set of addresses, an address being generated for each of the received symbols to indicate the OFDM carrier signal from which the received data symbol is to be mapped into the output symbol stream, the step of generating the set of addresses including using a linear feedback shift register including a predetermined number of register stages to generate a pseudo-random bit sequence in accordance with a generator polynomial;

using a permutation circuit to receive the content of the shift register stages and to permute the bits present in the register stages in accordance with a permutation order to form an address; and re-generating an address when a generated address exceeds the predetermined number of carriers, wherein by switching from a 2k operating mode, or an 8k operating mode to a 4k operating mode, the predetermined number of OFDM carrier signals is a maximum of four thousand and ninety six, the linear feedback shift register has eleven register stages with a generator polynomial for the linear feedback shift register of $R'_i[10]=R'_{i-1}[0]\oplus R'_{i-1}[2]$, and the permutation order forms an eleven bit address $R_i[n]$ for the i-th data symbol from the bit present in the n-th register stage $R'_i[n]$ in accordance with the table:

| $R'_i[n]$ for n = | 10 | 9 | 8 | 7 | 6 | 5 | 4 | 3 | 2 | 1 | 0 |
|---|---|---|---|---|---|---|---|---|---|---|---|
| $R_i[n]$ for n = | 7 | 10 | 5 | 8 | 1 | 2 | 4 | 9 | 0 | 3 | 6. |

31. An address generator for use with transmission or reception of data symbols interleaved onto sub-carriers of an Orthogonal Frequency Division Multiplexed symbol in accordance with a plurality of different operating modes, each of which provides a different number of OFDM carriers, the address generator being configured to generate a set of addresses, each address being generated for each of the data symbols to indicate one of the carrier signals onto which the data symbol is to be mapped, the address generator comprising:

a linear feedback shift register including a predetermined number of register stages and being configured to generate a pseudo-random bit sequence in accordance with a generator polynomial;

a permutation circuit configured to receive the content of the shift register stages and to permute the bits present in the register stages in accordance with a permutation order to form an address; and a control unit configured in combination with an address check circuit to re-generate an address when a generated address exceeds the predetermined number of carriers, wherein the address generator is switchable between 2k, 4k and 8k operating modes, and wherein for the 4k mode, the predetermined number of OFDM carrier signals is a maximum of four thousand and ninety six, the linear feedback shift register has eleven register stages with a generator polynomial for the linear feedback shift register of $R'_i[10]=R'_{i-1}[0]\oplus R'_{i-1}[2]$, and the permutation order forms an eleven bit address $R_i[n]$ for the i-th data symbol from the bit present in the n-th register stage $R'_i[n]$ in accordance with the table:

| $R'_i[n]$ for n = | 10 | 9 | 8 | 7 | 6 | 5 | 4 | 3 | 2 | 1 | 0 |
|---|---|---|---|---|---|---|---|---|---|---|---|
| $R_i[n]$ for n = | 7 | 10 | 5 | 8 | 1 | 2 | 4 | 9 | 0 | 3 | 6. |

* * * * *